(12) United States Patent
Tydtgat et al.

(10) Patent No.: US 11,588,077 B2
(45) Date of Patent: Feb. 21, 2023

(54) DISPLAY WITH QUANTUM DOT OR QUANTUM PLATELET CONVERTER

(71) Applicant: BARCO N.V., Kortrijk (BE)

(72) Inventors: Claude Daniel Tydtgat, Ledegem (BE); Jasper Irene Lambert, Waregem (BE); Stephanie Cyriel Adrianna Van Haecke, Sint-Eloois-Vijve (BE)

(73) Assignee: BARCO N.V., Kortrijk (BE)

( * ) Notice: Subject to any disclaimer, the term of this patent is extended or adjusted under 35 U.S.C. 154(b) by 31 days.

(21) Appl. No.: 17/253,152

(22) PCT Filed: Jul. 1, 2019

(86) PCT No.: PCT/EP2019/067634
§ 371 (c)(1),
(2) Date: Dec. 17, 2020

(87) PCT Pub. No.: WO2020/002710
PCT Pub. Date: Jan. 2, 2020

(65) Prior Publication Data
US 2021/0328113 A1    Oct. 21, 2021

(30) Foreign Application Priority Data

Jun. 29, 2018  (GB) .................................. 1810774
Jul. 4, 2018   (EP) .................................. 18181789

(51) Int. Cl.
*H01L 33/50* (2010.01)
*H01L 27/15* (2006.01)
*H01L 33/00* (2010.01)

(52) U.S. Cl.
CPC .......... *H01L 33/502* (2013.01); *H01L 27/156* (2013.01); *H01L 33/005* (2013.01); *H01L 2933/0041* (2013.01)

(58) Field of Classification Search
CPC ... H01L 33/502; H01L 27/156; H01L 33/005; H01L 2933/0041; H01L 33/50; H01L 25/0753
See application file for complete search history.

(56) References Cited

U.S. PATENT DOCUMENTS 9,728,687 B2 * 8/2017 Stott ..................... H01L 33/507
9,865,577 B2   1/2018 Bibl
(Continued)

FOREIGN PATENT DOCUMENTS

WO    2017007770 A2    1/2017

OTHER PUBLICATIONS

International Preliminary Report on Patentability for corresponding PCT application No. PCT/EP2019/067634 dated Dec. 29, 2020.
(Continued)

*Primary Examiner* — Jonathan Han
(74) *Attorney, Agent, or Firm* — Hamre, Schumann, Mueller & Larson, P.C.

(57) ABSTRACT

A display device including an array of pixels, each pixel including at least three sub-pixels having a LED device emitting light with a blue color point. The first sub-pixel is designed to emit red light having a first color point, the second sub-pixel is designed to emit green light having a second color point, where the LED device of the third sub-pixel is covered with a third wavelength converting layer designed to emit light having a fourth color point. The fourth color point being such that the combination of light emitted by the LED device not converted by the wavelength converting layer and the light converted by the wavelength converting layer results in light having a third color point, where the first, the second and the third color points define a second color space in which a set color space is included.

20 Claims, 12 Drawing Sheets

(56) References Cited

U.S. PATENT DOCUMENTS

2018/0190625 A1* 7/2018 Steckel ............... H01L 25/0753
2018/0375000 A1* 12/2018 Kim ................... H01L 25/0753

OTHER PUBLICATIONS

ISR and Written Opinion for corresponding PCT application No. PCT/EP2019/067634 dated Oct. 10, 2019.
European Search report in corresponding European application No. 18181789.1, dated Dec. 20, 2018.

* cited by examiner

DISPLAY WITH QUANTUM DOT OR QUANTUM PLATELET CONVERTER

FIELD OF THE INVENTION

The present invention relates to improvements in LED displays with conversion layers and to methods of designing such displays as well as a pixel structure and a method of manufacturing and driving an LED display.

BACKGROUND

U.S. Pat. No. 9,728,687 "Quantum Platelet Converter" describes an exemplary LED device that includes a QPC downconverter that converts an LED-emitted light at an emission wavelength to light of a longer wavelength. As illustrated in FIG. 1, which corresponds to FIG. 8 of U.S. Pat. No. 9,728,687, such a LED device 100 includes an LED die or chip 102. An encapsulant 106, such as silicone, can be disposed over the LED die or chip 102 that emits UV or blue light. The encapsulant 106 can function as a matrix for holding one or more QPC downconverters 108 and 110. The encapsulant and the QPC downconverters form a wavelength converting layer 104. The QPC downconverters 108 can include different QPC structures for down converting the blue light emitted by the LED chip 102 to different longer optical wavelengths, e.g., light in red, green, or yellow colors. For example, the QPC downconverters 108 can include red QPC structures (108) for converting blue light into red light, green QPC structures (110) for converting blue light into green light, yellow QPC structures for converting blue light into yellow light, or combinations of two or all three types of the above QPC structures. The various QPC structures can be embedded into the encapsulant 106 which can include a binder material such as silicone.

In addition, as illustrated on FIG. 2, which corresponds to FIG. 11 of U.S. Pat. No. 9,728,687, a transparent layer 112 can be positioned between the QPC embedded wavelength converting layer 104 and the LED chip 102. The transparent layer can operate as a heat spreading layer to reduce negative effects of heat on the color conversion materials 102 and functions also as an optical peak flux reduction layer by spreading the LED light over a larger surface, typically called a "remote phosphor" application as in high power lighting.

U.S. Pat. No. 9,865,577 "LED display with wavelength converting layer" describes a pixel for which the R, G and B sub-pixels that use the same Blue, Deep Blue or UV LED for all of the red, green and blue sub-pixels. The Blue, Deep Blue or UV LEDS 400 are bonded on a substrate 102 and covered with a wavelength converting layer 310. A light/heat distribution layer 320 can be formed between the LED 400 and the conversion layer 310.

FIG. 3A of the present invention is a schematic side view illustration of a pixel 106 in accordance with the known art. FIG. 3A corresponds to FIG. 11B of U.S. Pat. No. 9,865,577. As illustrated in FIG. 3A, each micro LED device 400 is designed to emit a deep blue (DB) color spectrum. The different wavelength converting layers 310 can be designed to emit red (R), green (G), and blue (B) in an RGB subpixel arrangement.

When using color conversion materials, typically the lower the excitation spectrum compared to the emission spectrum, the better the absorbance of the color conversion material. The absorption cross-section of an NPL (Nanoplatelet) or QDOT depends on the excitation wavelength. For a particular conversion material there may be a peak in the absorbance. FIG. 7 shows the spectrum of a Lumidot™ CdSe/ZnS 610 nm red emitting quantum dot particles from Sigma-Aldrich®. The line 710 represents the absorption spectrum. As can be seen in the Figure, there is a local absorption peak 730 (due to the first exciton level) close to the emission peak, but the absorbance is much stronger for wavelengths below 500 nm. Different conversion materials and same materials with different emission peak wavelengths will show an exciton peak at different wavelengths, but all will show the increase of absorption towards deeper blue.

The smaller the absorption cross-section, the more QDots/NPLs are needed to obtain a full color conversion. Using a deep blue/UV excitation source has two advantages; (1) the absorption cross-section is significantly larger at lower wavelengths reducing the required concentration significantly (factor 4 to 10 or even more) and (2) as the required concentration is lower, the average path length for reabsorption will decrease. This second advantage is explained as follows; when a blue photon is absorbed and converted to red, the red photon can meet another color QDOT/NPL and be re-absorbed. It has then two possibilities; the QDOT/NPL can re-emit a red photon or it can be converted to heat. The possibility that the absorbed red photon is converted to heat increases of course the higher the concentration of QDOTs/NPLs. So, decreasing the concentration of color conversion materials increases the red photon escape probability.

The use of a deep blue excitation source is required to obtain a good efficiency as (1) it provides a higher absorption efficiency and (2) it decreases the reabsorption probability.

However, in an RGB display, the requirements as to the color points are stringent. For example, a certain color rectangle as or Rec709, DCI-P3, Rec2020 or any other is required to be achieved. In that case the native deep blue LED cannot be used as the blue color point for the display as it is well beyond these color triangles. The display would miss a large amount of blue/cyan color points. One solution to this problem is to use another blue LED for the blue color point, without color conversion materials. However, this means that two kinds of LEDs should be used: deep blue for red and green conversion and normal blue (around 465 nm) for blue color.

From a manufacturing point of view this means that two different blue LEDs need to be stuffed. High resolution LED walls are typically stuffed with so called mass-transfer techniques as the pick-and-place single component methods become too expensive. Thus, using two different blue LEDs is less compatible with mass-transfer techniques as two steps are required. Using the same blue LED would ease/enable the mass-transfer technique and ease also the logistics, reducing the high cost of a high-resolution LED display. A solution needs to be found to avoid the use of two types of LEDs or the use of a 465 nm like LED to generate the blue emission.

FIG. 3B of the present invention is a schematic side view illustration of a pixel in accordance with the known art, which corresponds to FIG. 11C of U.S. Pat. No. 9,865,577. As illustrated in FIG. 3B, each micro LED device is designed to emit a blue (B) color spectrum. In such an embodiment, the different wavelength converting layers 310 can be designed to emit red (R) and green (G). A wavelength converting layer 310 is not formed over the third light distribution layer 320. In this manner an RGB subpixel arrangement is achieved without having to convert the blue light from the blue emitting subpixel. The blue light in U.S. Pat. No. 9,865,577 is defined as having a spectrum in the range of 450 nm to 495 nm.

Unfortunately, other problems occur in this case. When using a blue diode (with a peak wavelength larger than 455 nm) for both the excitation of the R and G converter layers and for the blue sub-pixel, more converter material is required to achieve the correct brightness that would be needed when using with a shorter peak wavelength for the excitation light.

FIG. 3C of the present invention is a schematic side view illustration of a pixel 106 in accordance with the known art (FIG. 11D from U.S. Pat. No. 9,865,577). As illustrated in FIG. 3C, each micro LED device 400 is designed to emit an ultraviolet (UV) color spectrum. In such an embodiment, the different wavelength converting layers 310 can be designed to emit red (R), green (G), and blue (B).

There are problems when using UV light in pixels. For instance, one must prevent UV light from seeping out of the conversion layers and prevent the UV lights from reaching the eyes of viewers looking at the display using these LEDs.

U.S. Pat. No. 9,865,577 "LED display with wavelength converting layer" also discloses the use of a dye or pigment dispersed in the wavelength converting layer to absorb colors other than green (for the green sub-pixel) or red (for the red sub-pixel). In particular, the dye or pigment dispersed in the conversion layer can absorb the blue or deep blue emission of the LED device thereby reducing bleeding of the unconverted blue or deep blue. This dye or pigment decreases the efficiency (input power to output luminance) of the structure. Indeed, at least some of the blue or deep blue light can be absorbed in the conversion layer before it can be down-converted to red or green light. This is likely to impact the overall power efficiency of a LED display making use of pixels as described in U.S. Pat. No. 9,865,577.

Pixels made of LEDs as described in U.S. Pat. Nos. 9,865,577 and 9,728,687 can be made smaller than what has been possible so far. Smaller pixels are a requisite to increase the resolution of LED displays. In the art, the space between pixels is usually a black matrix that increases the contrast ratio of the LED display. As the resolution increases, the ratio of the area occupied by the LED over the area of the black matrix increases as well. This means that the optical properties of the LED or the package of the LED have/has more effect on the contrast ratio of the LED display. Indeed, more ambient light interacts with the LED or their package than with the black matrix between LED. Solutions are required to prevent a decrease of the contrast ratio.

There is need for improvement in the art.

SUMMARY OF THE INVENTION

Some of the problems still present with LED displays with conversion layers of the art are given below whereby one or some or all of these problems can be solved by embodiments of the present invention:

The contrast ratio of a LED display is more and more influenced by the surface of the pixels and less by the black matrix between pixels. The color space that can be realized when the deep blue diode used as excitation light is the same as the blue diode used in the blue sub-pixel is not as recommended in the standards like e.g. Rec709 or Rec2020.

Using deep blue plus color converter allows reproducing the required color space but (1) too deep blue or UV limits the use of materials as many of transparent materials have an absorption edge in UV, (2) the display may emit some UV, (3) too deep blue or UV introduces larger Stokes shift losses.

Using the same blue LED, compatible with the color space, for a blue sub-pixel and as excitation for red and green down-converting material requires higher concentrations of color conversion materials, leading to lower energy conversion efficiency. This energy loss is converted to heat. However, an increase of temperature decreases the efficiency again as conversion layers relying on quantum dots or quantum platelets are (very) sensitive to temperature variations: as temperature increases, the quantum yield is negatively impacted.

In embodiments of the present invention a pixel structure and a display are each provided wherein a deep blue LED is used for the best efficiency. Q-dots can be used as conversion layer. A LED panel can be fitted with the same deep blue LEDs for all subpixels and no LED sorting is required.

The deep blue color point can be detrimental to certain color standards, e.g. it can be too deep in the spectrum locus. By using a green conversion layer e.g. a Quantum Dot, (providing blue wavelength difference from 25 nm up to 45 nm) with a certain color coordinate and the residual light from the deep Blue LED with a certain color coordinate, a new blue color point is created.

It is an object of the present invention to provide a pixel structure comprising at least three sub-pixels, each sub-pixel comprising a LED device configured to emit a color spectrum having a light source color point, the three LED devices being of the same type,
  wherein the LED device of the first sub-pixel is covered with a first wavelength converting layer designed to emit red light having a first color point,
  the LED device of the second sub-pixel is covered with a second wavelength converting layer designed to emit green light having a second color point,
  the light source color point, the first color point and the second color point defining a first color space which is different from a set color space,
  characterized in that the LED device of the third sub-pixel is covered with a third wavelength converting layer designed to emit light with a dominant wavelength having a fourth color point, said fourth color point being such that the combination of light emitted by the LED device not converted by the wavelength converting layer and the light converted by the wavelength converting layer results in light having a third color point, wherein the first, the second and the third color points define a second color space in which the set color space is included.

The three LED devices of the pixel structure are preferably from the same manufacturer. The three LED devices of the pixel structure preferably emit light of the same color. The light emitted by the LED devices of the first to third subpixels of the pixel structure is preferably the same and has a dominant wavelength equal to or less than 455 nm.

The light emitted by the LED devices of the first to third subpixels of the pixel structure is the same and has a dominant wavelength in the interval of 420 nm to 455 nm, or a dominant wavelength less than 455 nm and more than 400 nm, or more than 380 nm, or more than the transparent absorption edge of the used materials in the pixels.

The wavelength emitted by the LED device of the third sub-pixel and the light emitted by the third wavelength converting layer differ at least by 25 nm, preferably up to 35 nm, and even more preferably up to 45 nm.

The set color space is not arbitrary. It is not under the control of the manufacturer of the display. The term "set color space" is in this application an accurate terminus technicus relating to a standard. The set color space can be any one of the color spaces defined by Rec 709, Rec 2020, sRGB, DCI-P3.

It is an object of the present invention is to provide, a display wherein for each pixel of the display, the pixel comprises a red, green and blue sub-pixel, each sub-pixel being driven by an identical light source or a light source of the same type, a display which can reproduce any color within a pre-defined color space or a color space defined by a standard, such as the Rec. 2020 (ITU-R Recommendation BT.2020) color space, the Rec. 709 standard, the DCI-P3 color space, etc. The pre-defined color space is not arbitrary. It is not under the control of the manufacturer of the display. The term "pre-defined color space" is an accurate terminus technicus relating to a standard.

To be able to reproduce these color spaces with red, green and blue light sources, the color space must be within the triangle formed by the three color points associated to the red, green and blue light sources. Using the deep blue LED as discussed in the prior art section, it is not possible to reproduce all the colors of the color spaces such as the Rec. 2020, the Rec. 709 (880 in FIG. 8) or the DCI-P3 (870 in FIG. 8), as colors in the cyan-blue region cannot be reproduced. In fact, the color point 850 of the deep blue LED is too low, as shown in FIG. 8. Other standards are not excluded by the present invention.

For example, for the REC. 709 color space (ITU-R Recommendation BT.709) the CIE coordinates of the red primary are (xr=0.64; yr=0.33); green primary (xg=0.30; yg=0.60); blue primary (xb=0.15; yb=0.06). Colors within the color gamut will fall within the triangle that connects the primaries. In the REC2020 color gamut, the CIE coordinates of the red primary are (xr=0.708; yr=0.292); green primary (xg=0.170; yg=0.797); blue primary (xb=0.131; yb=0.046). It is an object of the present invention is to provide, a display device comprising an array of pixels, each pixel comprising at least three sub-pixels, each sub-pixel comprising a LED device configured to emit a color spectrum having a light source color point, wherein the LED device of the first sub-pixel is covered with a first wavelength converting layer designed to emit red light having a first color point, the LED device of the second sub-pixel is covered with a second wavelength converting layer designed to emit green light having a second color point, the light source color point, the first color point and the second color point defining a first color space which is different from a set color space, characterized in that the LED device of the third sub-pixel is covered with a third wavelength converting layer designed to emit light with a dominant wavelength having a fourth color point, said fourth color point being such that the combination of light emitted by the LED device not converted by the wavelength converting layer and the light converted by the wavelength converting layer results in light having a third color point, wherein the first, the second and the third color points define a second color space in which the set color space is included.

All exciting LED devices are preferably the same, e.g. emitting the same color and preferably supplied by the same manufacturer. The exciting LED devices may even by from the same manufacturing batch. If all excitation LED devices are the same, no re-alignment is required when robots pick and place different excitation LED devices. Also less time can be lost between batches. This makes sourcing and procurement issue much easier and can reduce cost.

The light emitted by the exciting LED devices can be outside the set color space that the display device is to display. With these exciting LED devices, the display device may display in a color space in which the set color space is included. The set color space can be the minimum color space that the display must be able to display. The set color space is not arbitrary. It is not under the control of the manufacturer of the display. The term "set color space" is an accurate terminus technicus relating to a standard.

It is an advantage that with three LEDs of the same type, emitting light which is not included in the set color space, it is possible to provide in an efficient way a color space in which the set color space is included. Using LEDs of the same type, or substantially identical LEDs, the manufacturing process of the display device in accordance with the present invention is improved as it is compatible with mass-transfer techniques as the pick-and-place single component methods. Furthermore, the required color space can be generated by the display in an efficient way.

Advantageously, the wavelength emitted by the LED device of the third sub-pixel and the light emitted by the third wavelength converting layer differ at least by 25 nm, preferably up to 35 nm, and even more preferably up to 45 nm.

Increasing the difference in wavelengths between the wavelength of the light excitation and light emission of the wavelength converting layer improves the efficiency of the wavelength converting layer.

Advantageously, the set color space is any one of Rec 709, Rec 2020, sRGB, DCI-P3. Such color spaces define standards or recommendations which need to be met by displays. Many technologies are unable to meet these stringent requirements as to color points which the RGB light sources have to meet. The present invention provide means to reach those target color spaces with LEDs of the same type for all red green and blue sub-pixels.

Advantageously, the fourth color point is such that it is located in the chromaticity diagram color space on the left of the line joining the light source color point and the third color point, above the third color point.

In order to reach the target color point or the third color point, using color mixing theory the inventors have observed that any point in the CIE chromaticity diagram on the left of the line joining the light source color point and the third color point of the target color space and above the color point of the light source can be chosen.

Accordingly, the thickness of the third wavelength converting layer and the density of down-converting material in the third wavelength converting layer is chosen such that the appropriate amount of light emitted by the LED of the third sub-pixel is being converted so as to achieve the third color point when the converted light having the fourth color point and unconverted light having the light source color point are combined These parameters determine the amount of light converted by the wavelength converting layer, which further determines the third color point of the light emitted by the third sub-pixel, which comprises the converted light and the unconverted light which passes through the wavelength converting layer.

Advantageously, the thickness of the wavelength converting layer and the density of down-converting material in the third wavelength converting layer are such that the obtained luminous flux of the light comprising the converted light and the unconverted light with the third color point is maximal.

Advantageously, the LED devices are configured to emit a color spectrum whose dominant wavelength is less than 455 nm and/or more than 420 nm, or more than 400 nm, or more than 380 nm, or more than the transparent absorption edge of the used materials in the pixels.

Advantageously, the light source color point is a blue color point.

It is an advantage that having an excitation wavelength towards the UV increases the absorption of the wavelength converting layer, and thereby improves the efficiency. However, this lower limit is determined by the transparent absorption edge of the used materials in the pixels.

Advantageously, the third wavelength converting layer is configured to emit light at a wavelength greater than 480 nm and/or preferably less than 520 nm, and even more preferably 490 nm when excited by the blue light emitted by the LED device of the third sub-pixel.

Such wavelengths have the advantage of providing the fourth color point which is required such that the converted light having this fourth color point when mixed with the unconverted light of the light source having the light source color point generate light with the third color point.

Advantageously, the third wavelength converting layer is configured to absorb less than 50%, preferably less than 20%, and even more preferably less than 10% of the blue light emitted by the third LED device.

In embodiments of the present invention, a small portion of the light emitted by the light source of the third sub-pixel needs to be absorbed and thus converted in order to provide the third color point upon mixing the converted and unconverted light.

Advantageously, the first wavelength converting layer is configured to emit light at 620 nm when excited by the blue light of the first LED device.

These wavelengths need to be compatible with the set color space. In the case of the Rec 709, Rec 2020, sRGB, etc. color space, an emission at 620 nm is optimal for the red. However, the invention does not restrict the use of such wavelengths if a different set color space is to be generated by the display, without departing from the spirit of the present invention.

Advantageously, the second wavelength converting layer is configured to emit light at 532 nm when excited by the blue light of the second LED device. The blue light emitted by the second LED device is preferably the same blue color emitted by the first LED device and the third LED device.

These wavelengths need to be compatible with the set color space. In the case of the Rec 709, Rec 2020, sRGB, etc. color space, an emission at 532 nm is optimal for the green. However, the invention does not restrict the use of such wavelengths if a different set color space is to be generated by the display, without departing from the spirit of the present invention.

Advantageously, preferably less than 10% or preferably less than 5% or preferably less than 1% of the blue light emitted by the LED device of the first sub-pixel escapes through the first wavelength converting layer, and/or wherein preferably less than 10% or preferably less than 5% or preferably less than 1% of the blue light emitted by the LED device of the second sub-pixel escapes through the second wavelength converting layer.

It is an advantage that most of the light emitted by the LED is converted by the wavelength converting layer of the first and second sub-pixel. Given the difference in wavelength between the excitation light and the emission light such a high efficiency is normally met.

Advantageously, the wavelength converting layer comprises quantum platelets or quantum dots.

Quantum dots and quantum platelets have the advantage of being small compared for example phosphor particles and have the advantage of providing pure colors and light with a narrow bandwidth. The wavelength emitted can also be selected by changing the size of the particles.

Advantageously, a first filter is positioned on the first wavelength converting layer, and/or a second filter is positioned on the second wavelength converting layer, and/or a third filter is positioned on the third wavelength converting layer.

The filters can be identical or different.

Advantageously, the first, second and third filters are screen or ink jet printed on the sub-pixels.

Advantageously, the first and/or second filters filter out blue light emitted by the respective LED devices that passes through the respective wavelength converting layer.

Filtering out the blue light which has not been converted within the first and second sub-pixel has the advantage of improving the contrast of the display device and improving the image quality.

Advantageously, the first and/or second filters absorb blue and optionally other wavelengths found in the spectrum of ambient light.

Advantageously, the first and/or second filters filter out blue light emitted by the respective LED devices which passes through the respective wavelength converting layer and/or wherein the first and/or second filters and/or third filters absorb at least a portion of wavelengths found in the spectrum of ambient light except for the wavelengths which correspond to the first color point for the first filter, the second color point for the second filter and the blue and fourth color point for the third filter.

It is a further advantage of providing a blue absorbing layer on the third wavelength converting layer which is configured to absorb ambient light.

Such filters have the advantage of increasing the contrast of the display device and can sharpen the desired emission spectrum of the sub-pixels of the display device according to the present invention.

Advantageously, the size of the pixels is less than 1 mm and the pixel pitch is at most 1 mm such that the display device is a high-resolution display device.

The present invention also provides a method of manufacturing a display device comprising:
- forming an array of pixels, each pixel comprising at least three sup-pixels, each sub-pixel comprising a LED device configured to emit a color spectrum having a light source color point,
- covering the first LED device of the first sub-pixel with a first wavelength converting layer designed to emit red light having a first color point,
- covering the second LED device of the second sub-pixel with a second wavelength converting layer designed to emit green light having a second color point,
- the light source color point, the first color point and the second color point defining a first color space which is different from a set color space,
- characterized by covering the third LED device of the third sub-pixel with a third wavelength converting layer designed to emit light with a dominant wavelength having a fourth color point, said fourth color point being such that the combination of light emitted by the LED device not converted by the wavelength converting layer and the light converted by the wavelength converting layer results in light having a third color point, wherein the first, the second and the third color points define a second color space in which the set color space is included. The blue light emitted by the LED devices should be the same and can have a dominant wavelength equal to or less than 455 nm, preferably in the interval of 420 nm to 455 nm. All exciting LED devices (i.e. first to third LED devices) are preferably the same, e.g. emitting the same color and preferably supplied by the same manufacturer. The exciting LED devices may even by from the same manufacturing batch. If all excitation LED devices are the same, no re-alignment is required when robots pick and place different excitation LED devices. Also less time can be lost between batches. This makes sourcing and procurement issue much easier and can reduce cost. The light emitted by the exciting LED devices can be outside the set color space that the display device is to display. With these exciting LED devices, the display device may display in a color space in which the set color space is included. The set color space can be the minimum color space that the display must be able to display.

In accordance with the present invention, there is provided a display device comprising an array of pixels, each pixel comprising at least three LED devices configured to emit a blue color spectrum, wherein the first of the three LED devices is covered with a first wavelength converting layer designed to emit red light, the second of the three LED devices is covered with a second wavelength converting layer designed to emit green light, characterized in that the third of the three LED devices is covered with a third wavelength converting layer designed to emit light with a dominant wavelength greater than the wavelength corresponding to a target blue color point such that the combination of light of the third LED device not converted by the wavelength converting layer and the light converted by the wavelength converting layer results in light having the target blue color point, the target blue color point being compatible with a set or pre-defined color space such as a standard color space.

In order to achieve the objective mentioned above, a pixel of a display has at least three light sources such as LED devices designed to emit a blue (B) color spectrum. One of the light sources such as the LED devices is covered with a first converting layer designed to perform wavelength conversion on the blue light and to emit red light (R). One of the light sources such as LED devices is covered with a second converting layer designed to perform wavelength conversion on the blue light and to emit green light (G). The third light source such as a LED device is covered with a third converting layer designed to perform wavelength conversion on the blue light. This wavelength conversion can be designed to adjust the color gamut or color space that can be displayed. For example, the third wavelength converter can be adapted to emit a certain amount of cyan light (C). The third converter layer can be designed to absorb less blue light than the first and second converter layer.

It is an advantage of that aspect of the invention that it allows to use the same exciting light sources such as LED devices for the R, G and B sub-pixels of a display such as an LED display without affecting the color space. This is achieved by the selection of three wavelength conversion materials to emit red, green and blue light.

It is another advantage of that aspect of the invention that it allows to use the same light sources such as LED devices for the R, G and B sub-pixels of a display such as an LED display without increasing the power dissipation.

It is another advantage of that aspect of the invention that it allows using the same light sources such as LED devices for the R, G and B sub-pixels of a display such as an LED display while decreasing the quantity of converter material required for the R and G sub-pixels. The light sources such as LED devices designed to emit a blue color spectrum preferably have a dominant wavelength of less than 455 nm.

The red wavelength converter layer can emit light at 620 nm when excited by the blue light emitted by the light source such as the LED device. The green wavelength converter layer can emit light at 532 nm when excited by the blue light emitted by the light source such as the LED device.

The third wavelength converting layer can emit light at a wavelength greater than 480 nm when excited by the blue light emitted by the light source such as the LED device as such that a target blue color point is obtained and absorb less than 50% of the blue light, preferably less than 20% or more preferably less than 10% of the blue light emitted by the LED device. The third wavelength converting layer can emit light at a wavelength of 490 nm when excited by the blue light emitted by the LED device and absorb less than 15% of the blue light.

BRIEF DESCRIPTION OF THE DRAWINGS

The following description of the figures of specific embodiments of the invention is merely exemplary in nature and is not intended to limit the present teachings, their application or uses.

Throughout the drawings, corresponding reference numerals indicate like or corresponding parts and features.

ACRONYMS AND DEFINITIONS

Figure 1:
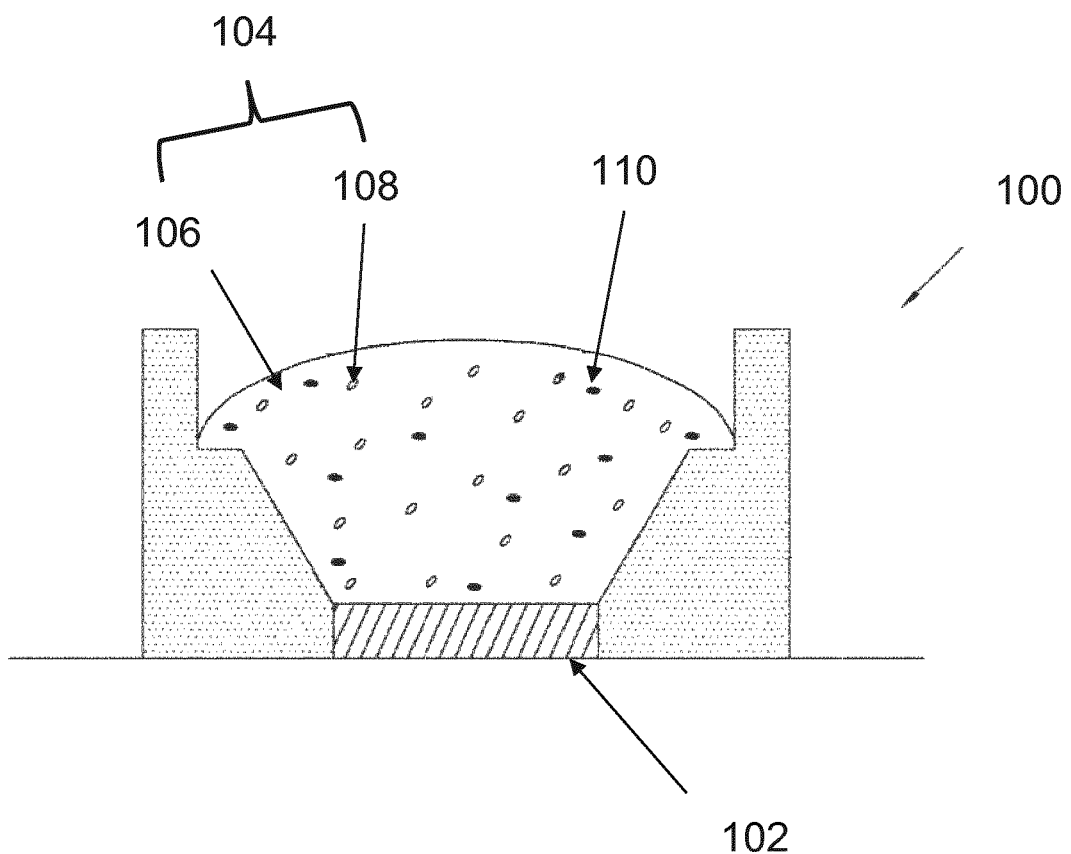
FIG. 1 is a schematic representation of an LED device with a QPC down converter according to the prior art.
Figure 2:
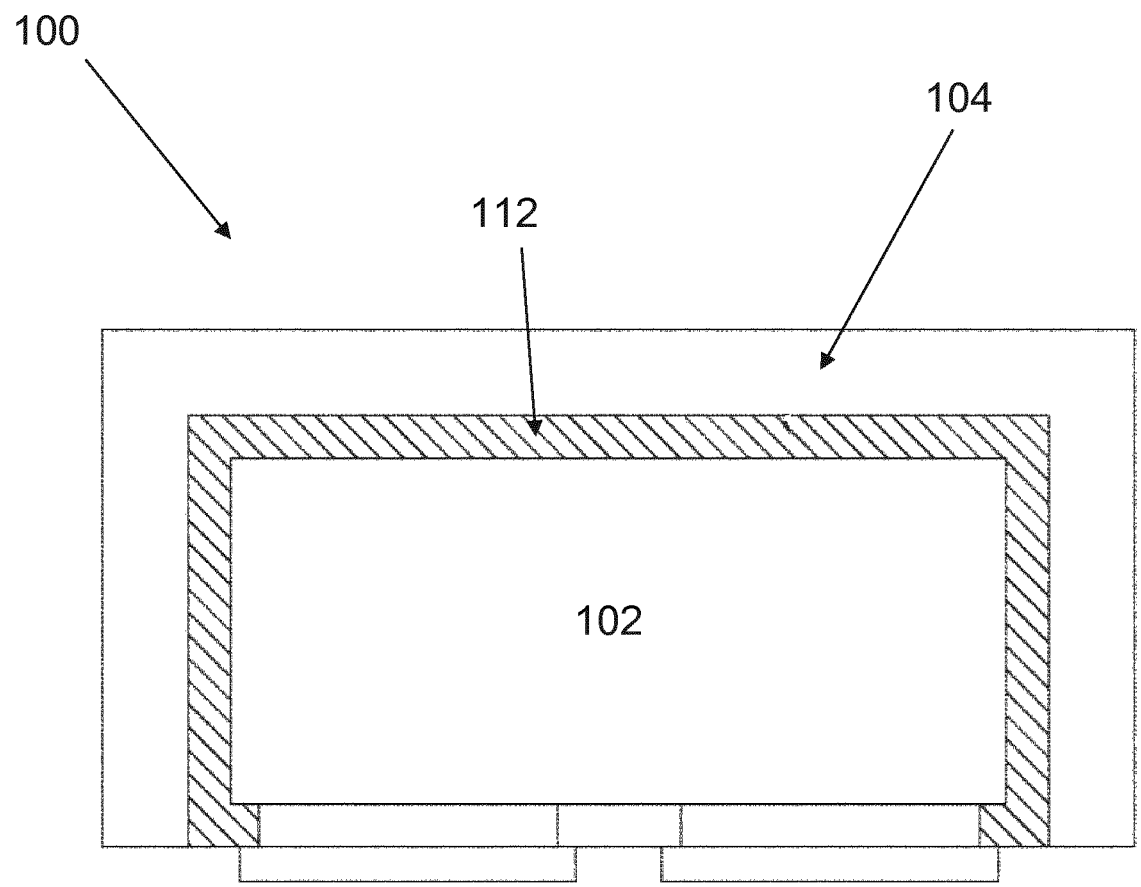
FIG. 2 is a schematic representation of an LED device according to the prior art.
Figure 3A:
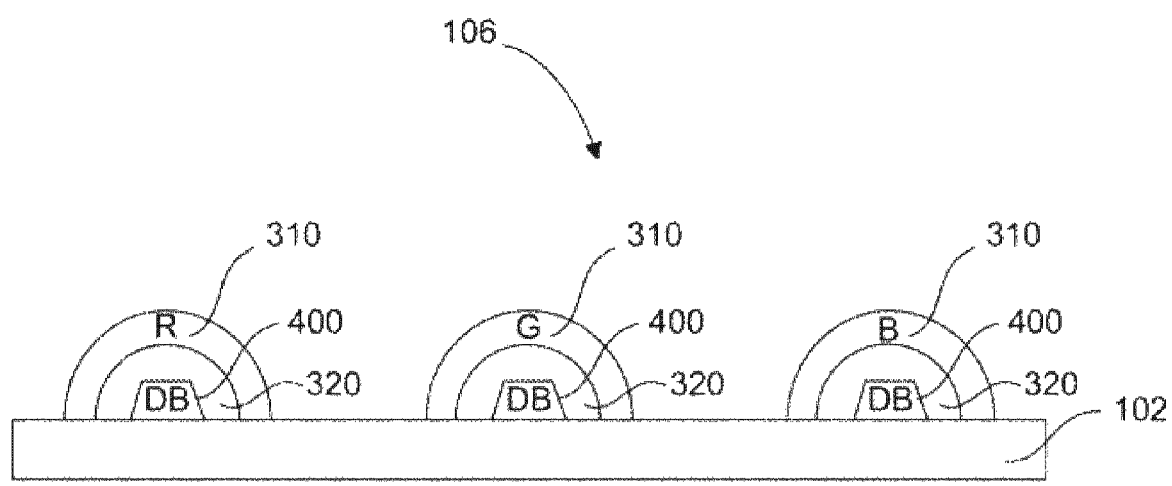
FIG. 3A is a schematic representation according to the prior art.
Figure 3B:
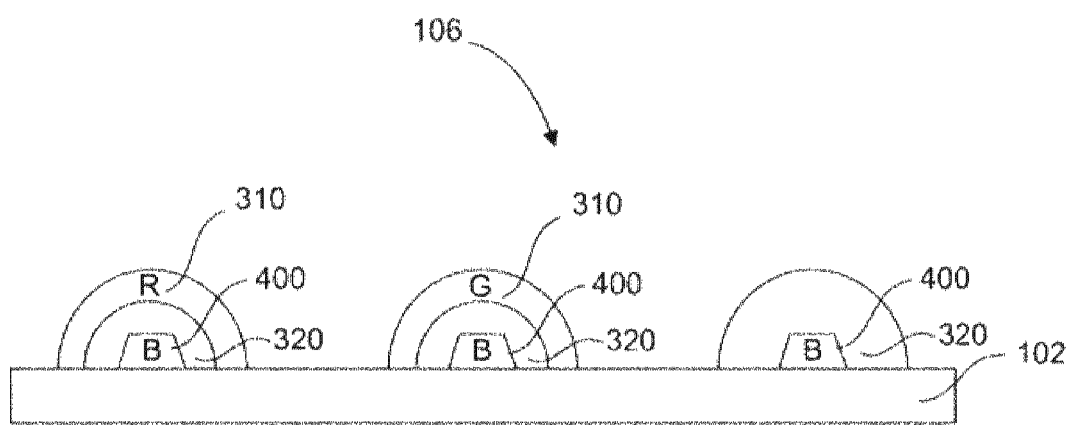
FIG. 3B is a schematic representation according to the prior art.
Figure 3C:
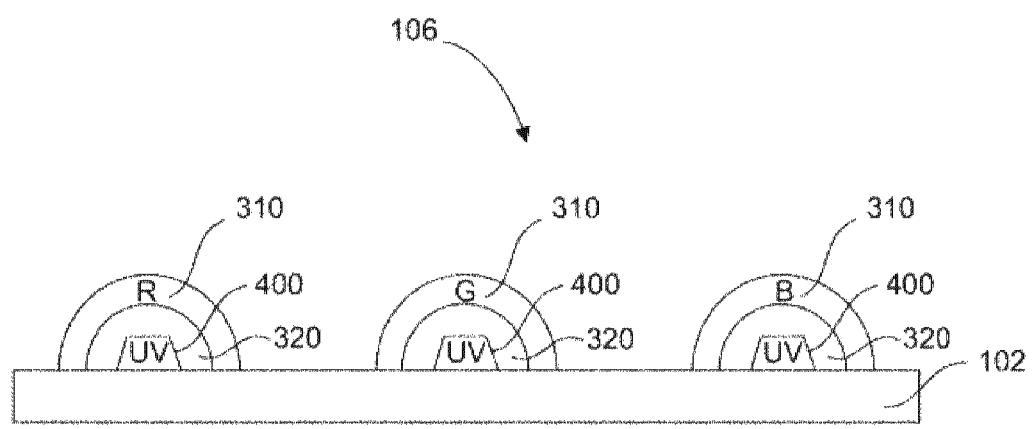
FIG. 3C is a schematic representation according to the prior art.

Color point A color point corresponds to the coordinates of a color in the chromaticity diagram, as the CIE 1931 color space.

Contrast Ratio is a property of a display system, defined as the ratio of the luminance of the brightest color (white) to that of the darkest color (black) that the system is capable of producing. A high contrast ratio is a desired aspect of any display.

Cyan is a greenish-blue color. It is evoked by light with a predominant wavelength of between 480-520 nm, or in the range 490-520 nm, i.e. between the wavelengths of green and blue light.

Deep blue light refers to light having wavelengths comprised in the range of 380 to 455 nm.

The Peak Light Wavelength is the highest wavelength emitted optically from the light source such as an LED device, while the Dominant Light Wavelength refers to the color shade perceived by the human eye.

Dominant wavelength is defined as the single wavelength that is perceived by the human eye. Generally, one light source consists of multiple wavelength spectrums from the light source rather than one single wavelength. Our brains turn those multiple spectrums into a single color of light consistent with a single specific wavelength which is what we see when we look at the light. That's the light source's Dominant wavelength.

High-resolution display For LED wall displays, the state of the art in high resolution is continuously increasing. Several years ago, like the giant billboard at Time Square, the pixel pitch was around 10 mm, a few years ago 4 mm was standard. Today high-resolution LED walls mean pixel pitches are in the order of 0.8 to 1.2 mm.

Identical light sources refer to light sources being substantially the same, or of the same type, i.e. within a given tolerance for the light spectrum they emit or the peak wavelength they emit. It can also refer to light sources coming from the same manufacturer and being manufactured by the same process. They may belong to a single batch.

Peak Wavelength. Peak wavelength is defined as the single wavelength where the radiometric emission spectrum of the light source reaches its maximum. More simply, it does not represent any perceived emission of the light source by the human eye, but rather by photo-detectors.

Quantum Platelet Converters (QPC) are two-dimensional semiconductors nanocrystals, typically 4 to 7 layers of crystal unit cells (e.g. CdSe), that possess unique optical properties. These are 2D structures, the excited electron-hole (=exciton) has only freedom in two dimensions, one dimension is prohibited, it is called 1D confinement. (Extreme case is one atom thick layer, e.g. graphene.). In contrast, quantum dots are spherical semiconductor nanocrystals, typically 50 to 200 unit cells in radius. These are "zero-dimensional" structures; the exciton has no freedom, it is called 3D confinement. There is of course also 2D confinement where the exciton has only one degree of freedom; these are called nano-rods (e.g. carbon nanotubes).

Both rely on the principle of band-gap tuning, and thus emission wavelength tuning, caused by the confinement effect.

Sub-pixel A sub-pixel is a component of a pixel which is designed for emitting light of a certain color, for example red, green or blue.

Wavelength converting layer A wavelength converting layer is a layer comprising down-converting material such as quantum dots or quantum platelets (also called nanoplatelets). The density of the down converting material required to have the most efficient conversion is determined by many factors. The most important ones are (1) the absorption cross section of deep blue photons; a high absorption cross section of deep blue photons reduces the number of particles required for full conversion, (2) the re-absorption cross section of the converted photons, (3) the concentration of the color conversion particles, and (4) the thickness of the layer.

Concentration and thickness are related to each other; the higher the concentration, the thinner the layer. Layer thickness can be made small, limited by the manufacturing method.

A set color space or a pre-defined color space are not arbitrary. They are not under the control of the manufacturer of the display. The terms "set color space" or "pre-defined color space" are each an accurate terminus technicus relating to a standard.

DETAILED DESCRIPTION OF THE INVENTION

The present invention will be described with respect to particular embodiments but the invention is not limited thereto but only by the claims. Any reference signs in the claims shall not be construed as limiting the scope.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order, unless specified. It is to be understood that the terms so used are interchangeable under appropriate circumstances and that the embodiments of the invention described herein are capable of operation in other sequences than described or illustrated herein. The terms or definitions used herein are provided solely to aid in the understanding of the invention.

The terms "about" or "approximate" and the like are synonymous and are used to indicate that the value modified by the term has an understood range associated with it, where the range can be +20%, +15%, +10%, +5%, or +1%. The term "substantially" is used to indicate that a result (e.g., measurement value) is close to a targeted value, where close can mean, for example, the result is within 80% of the value, within 90% of the value, within 95% of the value, or within 99% of the value.

In order to avoid the problems associated with the prior art, the inventors have made the following observations. Using a deep blue light source such as a deep blue LED, e.g. 450 nm provides the advantage of increasing significantly the absorption cross section of the green and red wavelength converters. However, for the blue color point, this blue 450 nm light is not fully converted efficiently to an optimum blue or target blue color point (e.g. 465 nm). In fact, the difference between the excitation and emission wavelengths is too small; it would be very inefficient. The inventors have found that by depositing, on top of the blue light source such as a blue LED (e.g. 450 nm) a small amount of cyan color wavelength converting material, e.g. 490 nm, a better blue color can be generated. This small amount of cyan is sufficient to generate, together with the blue 450 nm light from the blue light source such as a blue LED, an optimized (target) blue color point while the difference between the excitation and emission spectrum is still large enough to obtain a significant efficiency. The blue light emitted by the LED devices should be the same and can have a dominant wavelength equal to or less than 455 nm, preferably in the interval of 420 nm to 455 nm. All exciting LED devices (i.e. first to third LED devices) are preferably the same, e.g.

emitting the same color (e.g. 450 nm) and preferably supplied by the same manufacturer. The exciting LED devices may even by from the same manufacturing batch. If all excitation LED devices are the same, no re-alignment is required when robots pick and place different excitation LED devices. Also less time can be lost between batches. This makes sourcing and procurement issue much easier and can reduce cost. The light emitted by the exciting LED devices can be outside the set color space that the display device is to display. With these exciting LED devices, the display device may display in a color space in which the set color space is included. The set color space can be the minimum color space that the display must be able to display.

Figure 4:
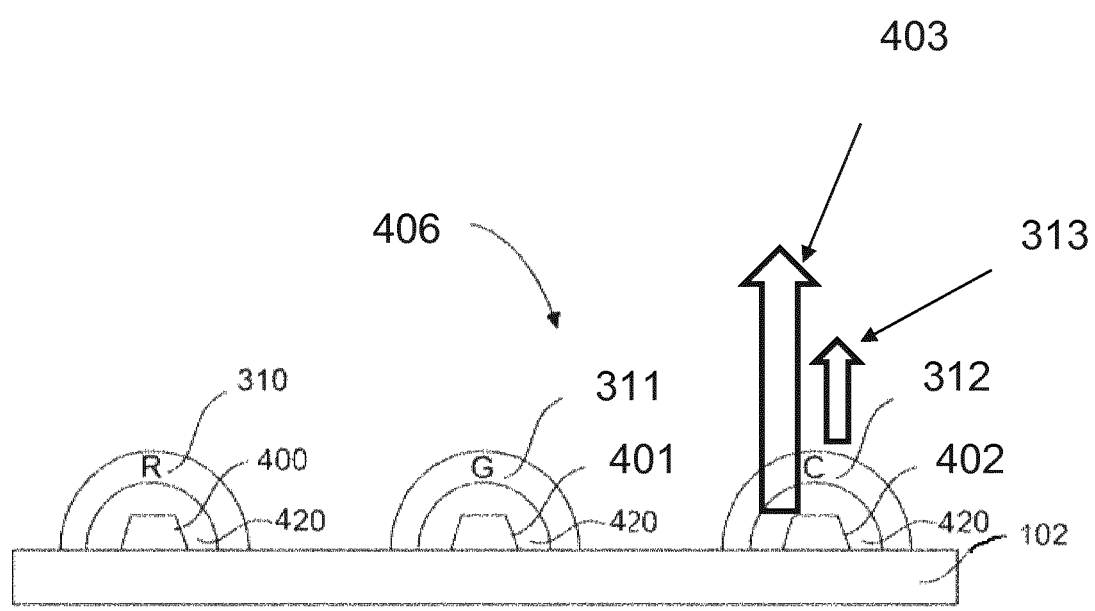
FIG. 4 is a schematic representation of a pixel structure according to an embodiment of the present invention.

A schematic representation of a pixel according to a first aspect of the invention is shown in FIG. 4. The pixel 406 has three subpixels. A first subpixel can be a red subpixel. A first blue LED 400 illuminates a first wavelength converting layer 310 designed to emit red light (R) when excited by the light emitted by the first blue LED 400. A second subpixel can be a green subpixel. A second blue LED 401 illuminates a second wavelength converting layer 311 designed to emit green light (G) when excited by the light emitted by the second blue LED 401. A third subpixel can be a blue subpixel. A third blue LED 402 illuminates a third wavelength converting layer 312 designed to emit light whose color point is such that the combination of the converted light and the unconverted light of the third blue LED results in emitted light having the target blue color point. If the target blue color point corresponds to light having a wavelength of 467 nm, and the blue LED emits light having a dominant wavelength of 450 nm, the third wavelength conversion element should emit light, when the wavelength converting layer is excited by the light emitted by the third blue LED 402, having a wavelength of about 490 nm, which corresponds to cyan light (C). The skilled person is well aware that the color point corresponding to the wavelength of the converted light or the color point corresponding to the target blue color point can be evaluated using additive color mixing theory in the CIE xy chromaticity diagram. The blue light emitted by the LED devices for all of the subpixels should be the same and can have a dominant wavelength equal to or less than 455 nm, preferably in the interval of 420 nm to 455 nm.

Preferably, the blue LEDs 400, 401 and 402 are substantially identical, in particular, they are designed to emit substantially the same spectrum of light. "Identical" can mean for instance that they are sourced from the same manufacturer under the same reference and exhibit properties (like dominant wavelength, spectrum half-width, radiant flux) within predetermined intervals which are identical or substantially identical within predetermined tolerances.

The blue light emitted by the LEDs 400, 401 and 402 has a dominant wavelength equal to or less than 455 nm, preferably in the interval of 420 nm to 455 nm. In fact, it is advantageous to use a blue which is as deep as possible as the absorption cross-section is larger for the red and green wavelength converting layers and there is less reabsorption, as described above. However, the lower limit is dictated by the absorption edge of the materials used and the use of harmful UV can be dangerous to the users.

The first wavelength converting layer 310 is designed to emit red light with a dominant wavelength of 620 nm, or substantially 620 nm. The tolerances with respect to the wavelength emitted by the first wavelength converting layer depends on the color space, as defined above, which is to be reproduced.

The thickness of the layer 310 and the density of down-converting material (like e.g. quantum dots or quantum platelets) in the wavelength converting layer is preferably such that the obtained conversion is maximal. For example, preferably less than 10% or preferably less than 5% or preferably less than 1% of the blue light emitted by the blue light source such as a diode 400 will seep through the wavelength converting layer 310. This will result in some blue leakage which can be absorbed by a layer on top.

The second wavelength converting layer 311 is designed to emit green light with a dominant wavelength of 532 nm, or substantially 532 nm. The tolerances with respect to the wavelength emitted by the first wavelength converting layer depends on the color space, as defined above, which is to be reproduced. The thickness of the layer 311 and the density of the down-converting material (like e.g. quantum dots or quantum platelets) is such that the obtained conversion is maximal. For example, less than 10% or preferably less than 5% or preferably less than 1% of the blue light emitted by the blue light source such as a diode 401 will seep through the wavelength converting layer 310. This will result in some blue leakage which can be absorbed by an additional layer on top.

As discussed above, with primary colors at 445 to 450 nm for blue for example, 532 nm for green and 620 nm for red, it is not possible to generate the color space required for LED displays that comply with an industry standard like the ITU-R Recommendation BT.709 aka Rec709 as all colors of this color space standard are not inside the triangle formed by the three color points which correspond to these three wavelengths. In fact, the green-blue part of the color space cannot be reproduced.

To overcome these problems, the third wavelength converting layer 312 is designed to emit further colors when excited by the light source, preferably having a spectrum whose wavelengths are higher than the desired blue color, such that the combination of this further color and the excitation wavelength provides the target blue color point. Hence the selection of the third wavelength converting layer 312 is to be such that a specific gamut or color space can be reached by pixels of the display. Thus, the wavelength converting layer can be configured to emit for example a cyan light. This is provided in order to generate the color space that can be covered by the pixel 406 and meet the requirements of Rec709 for example. The spectrum of the light emitted by the third wavelength converting layer preferably has a dominant wavelength which is preferably at least of 480 nm, more preferably in the range of 480 nm to 520 nm, and even more preferably at e.g. 490 nm.

The thickness of the layer 312 and the density of down-converting material (like e.g. quantum dots or quantum platelets) in the third wavelength converting layer 312 can be such that the obtained luminous flux with the correct (or target) blue color point is maximal. For example, as illustrated on FIG. 4, 80% or more of the blue light 403 emitted by the blue light source such as the diode 402 will exit the wavelength converting layer 312 without being converted. The blue light 403 exiting the wavelength converting layer 312 (this light not being converted) and the cyan light 313 emitted by the conversion layer (the converted light) mix through the conversion layer 312. Thus, the thickness of the layer and the density of down-converting material is chosen such that the appropriate amount of light emitted by the light source is being converted so as to achieve the target color point when the converted and unconverted lights are being combined. Thus, the following parameters have to be taken into account simultaneously in the design in order to achieve the desired effect: the wavelength of the light source (or blue LED), the target blue color point (or wavelength), the wavelength of the light emitted by the third wavelength converting layer after excitation by the light source, the thickness of the wavelength converting layer and the density of down-converting material in the wavelength converting layer.

Figure 8:
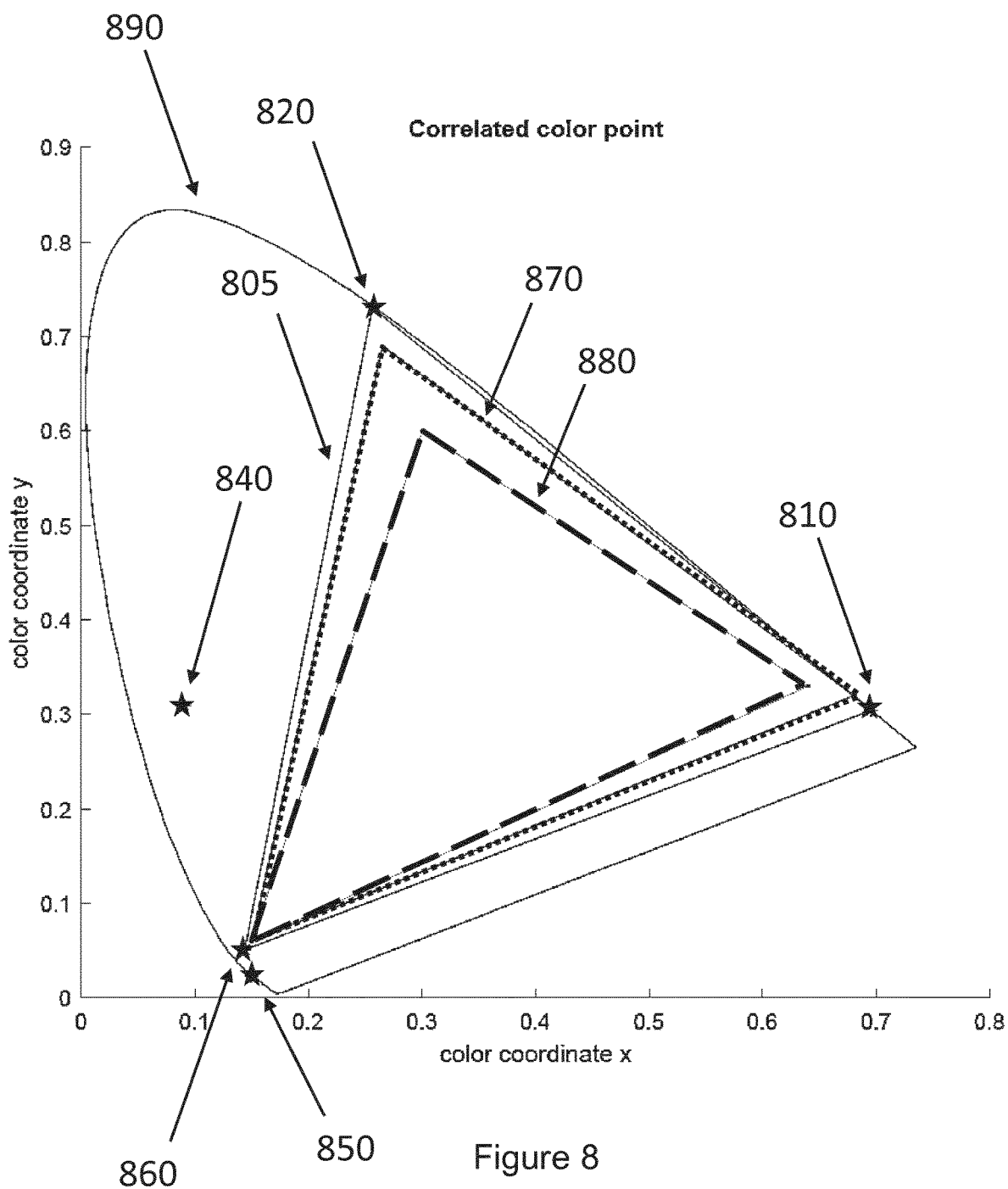
FIG. 8 illustrates the CIE 1931 color space chromaticity diagram and the various color spaces which can be achieved in accordance with embodiments of the present invention.

FIG. 8 illustrates the CIE color space, the spectrum loci 890 and the various color spaces defined by a standard such as the Rec. 709 (880), the DCI P3 (870). The red color point 810, the green color point 820 and the target blue color point 860 form a triangle 805 in which the various color spaces are included. The color point which corresponds to the deep blue light source is represented by 850. In order to achieve the target blue color point 860, light emitted by the light source has to be combined with light having the color point 840 in the cyan area. The cyan color point 840 should be further away from the target blue color point 860 than the deep blue color point 850 for efficiency reasons (the wavelengths need to be further apart). One can see that all three color points (840, 850, 860) are on the same line in the color space, and the target blue color point can be calculated as a weighted arithmetic mean of the light source color point 850 and the cyan color point 840 weighted by their intensity. In the example of FIG. 8, the blue light source emits a wavelength of 440 nm with a FWHM of 19 nm and the wavelength converting layer emits a wavelength of 490 nm with a FWHM of 50 nm after excitation by the blue light source. To reach the target blue color point, the contribution of the unconverted blue light is of 92% and of the converted cyan light is of 8%.

As outlined above, the skilled person is aware that the theory on additive color mixing can be used to evaluate the contributions of unconverted light and converted light required to reach the target blue color point. In practice, the contribution of unconverted light and converted light to reach the target blue color point depends on many factors. A first guess can be made. This first guess can be made using the additive color mixing theory and will be more precise if the spectral bandwidth of the light source and the emitted light by the wavelength converting layer are known. To arrive at the correct values, in practice, measurements on the color point of the combined beam are made.

Thus, to reach the target blue color point, the third wavelength converting layer should emit light at a wavelength greater than 480 nm when excited by the blue light emitted by the light source such as the LED device. The third wavelength converting layer should also absorb less than 50% of the LED blue light, preferably less than 20% or more preferably less than 10% of the blue light emitted by the LED device in order to reach the target blue color point.

Figure 9:
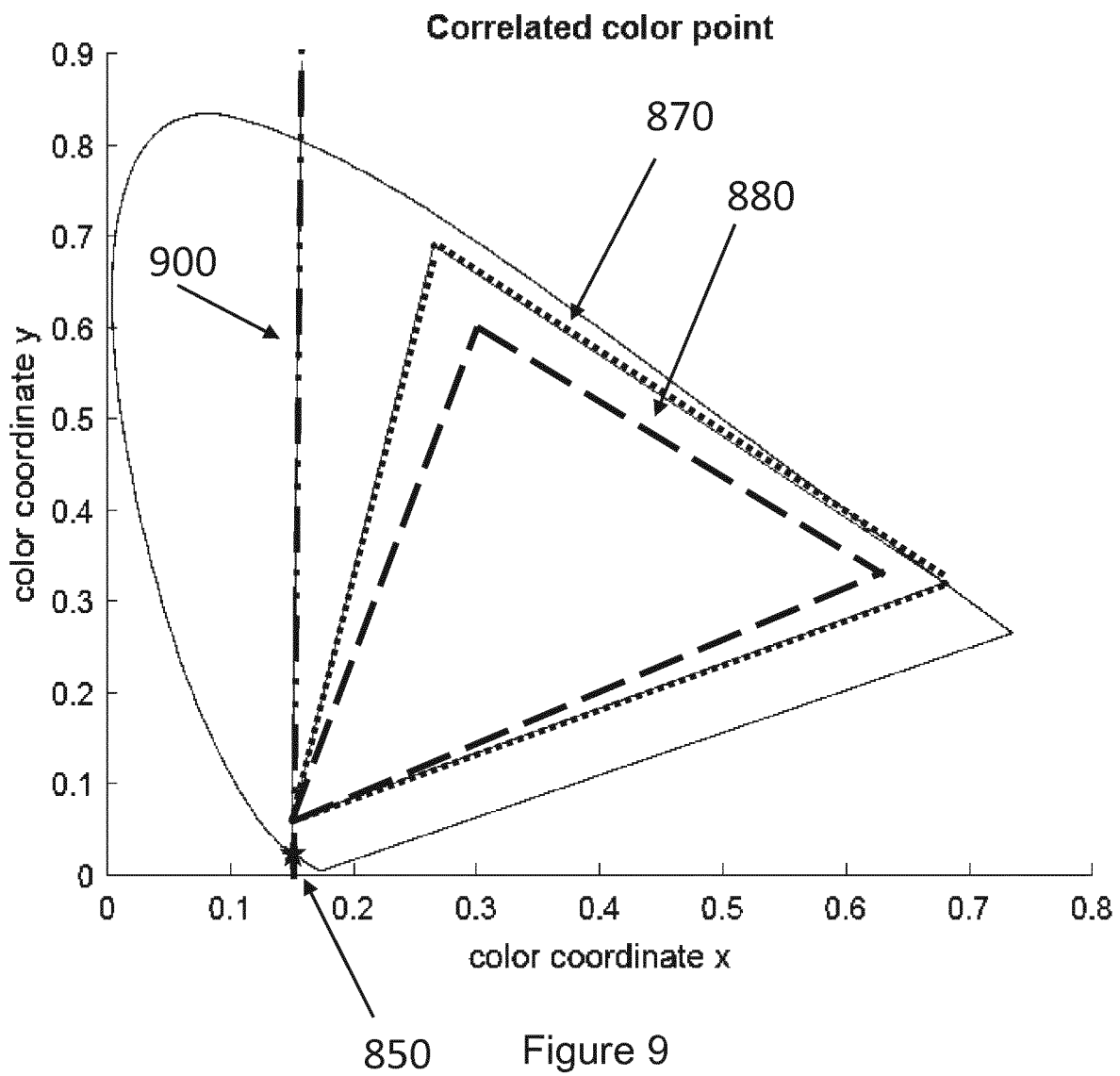
FIG. 9 illustrates the color space and which color points achieved with the third wavelength converting layer which can be selected to achieve the target blue color point when the blue light source emits at 440 nm.
Figure 10:
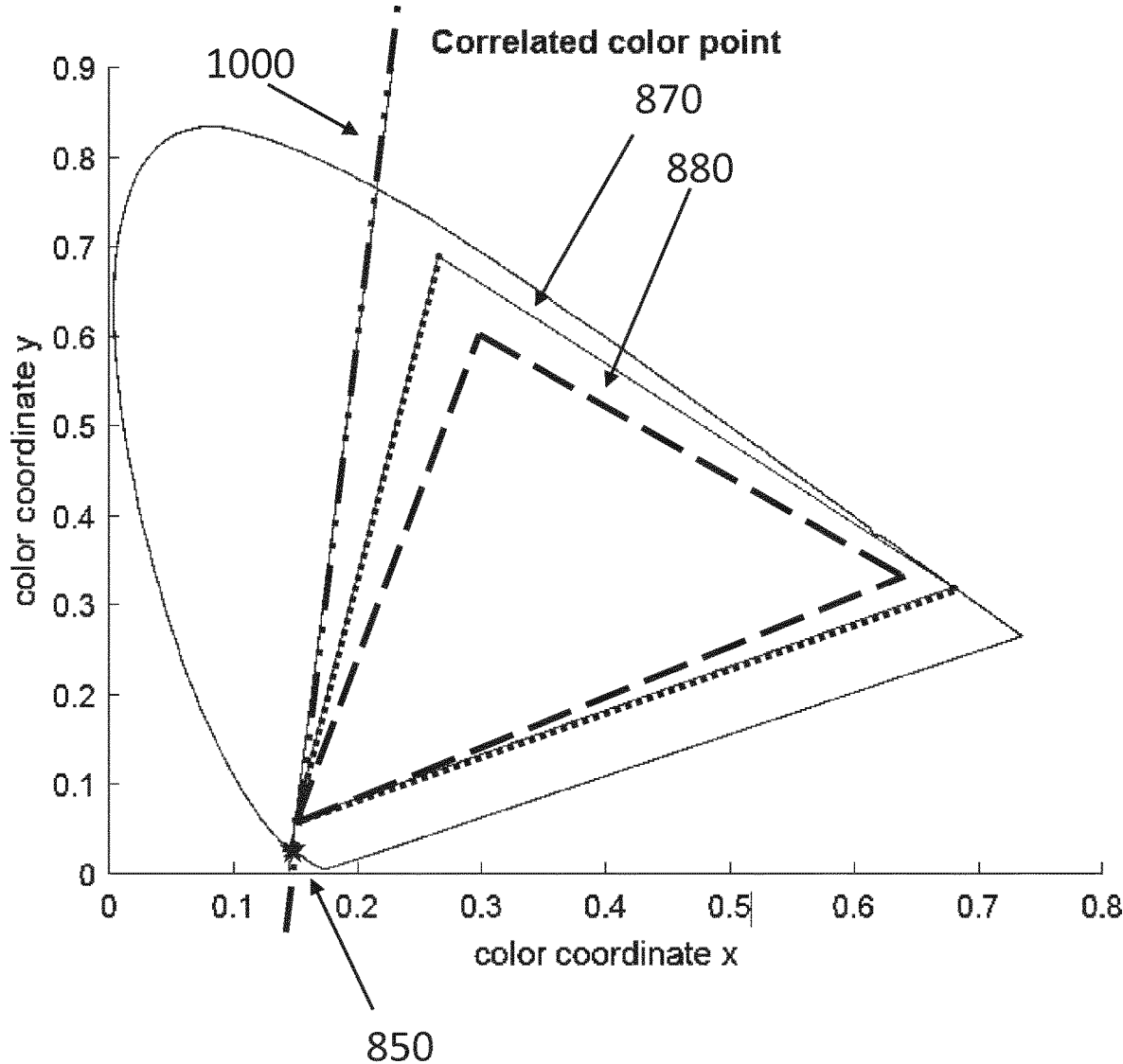
FIG. 10 illustrates the color space and which color points achieved with the third wavelength converting layer which can be selected to achieve the target blue color point when the blue light source emits at 445 nm.

FIGS. 9 and 10 show which color points which correspond to the wavelength emitted by the wavelength converting layer can be selected in theory with a blue light source emitting at 440 nm and at 445 nm respectively. All the color points on the left of line 900 in FIGS. 9 and 1000 in FIG. 10 can in theory be selected to achieve the target color point with the 440 nm and 445 nm light source respectively. However, one must not forget the efficiency requirement dictated by the difference in wavelengths between the excitation wavelength of the light source and emission wavelength of the wavelength converting layer, which should be at least of 25 nm, preferably up to 35 nm, and even more preferably up to 45 nm.

The space between the blue light sources such as LED 400, 401 and 402 and the wavelength converting layer they illuminate, can be empty or filled (in whole or in part) with a filler material. The filler material can act as a peak flux remover and thermal heat spreader to limit heat exchanges between the light sources such as the LED's and the wavelength converting layer.

An example of LED' 400, 401, 402 is the ES-VADBA12B from Epistar® with a dominant wavelength in the interval [445 nm-455 nm] and a spectral half-width of 25 nm.

Using a light source or LED emitting light at 405 nm as excitation wavelength for the wavelength converting material forms part of the scope of the present invention. However, depending upon how deep the blue is, the following effects can occur:

(1) the display could emit some of this UV light but due to safety reasons this should be avoided, (2) many optical transparent materials are absorbed by UV and as such choosing a UV LED would exclude already many standard economical materials or off the shelf materials, and (3) the deeper the blue, the larger the Stokes shift losses. For example, when a 405 nm photon is absorbed and a red 620 nm photon is emitted, the upper limit efficiency one can get is determined by the ratio 405/620=65% due to the quantum nature of the problem.

Thus, for display applications, the wavelength of the blue light source should preferably be in the range of e.g. 420 nm to 455 nm, with the lower boundary determined by the transparent absorption edge of the used materials.

As discussed above, the deeper the wavelength of the blue light source, the higher is the absorption of the down-converting material (or wavelength converting layer). This effect is illustrated on FIG. 7. Reducing the excitation wavelength has the effect of increasing the absorption, which is shown on FIG. 7 with line 710. As discussed above, decreasing the wavelength towards the ultra violet spectrum increases the absorption. A lower limit in the UV spectrum is to be defined based as mentioned above primarily on the transparent absorption edge of the used materials, on the safety issues related to UV as known by the skilled person, and the Stokes shift.

Thus, the light sources, or LED light source, can emit light in the deep blue or having a wavelength in the range of 380 to 455 nm, or 400 to 455 nm, or 420 to 455 nm, with the lower boundary determined by the transparent absorption edge of the used materials.

With the wavelengths ranges described above, using the cyan color converting material deposited onto the blue light source such as a deep blue LED, the blue color point can be corrected and shifted towards the target blue color point, and as such solves for the problems mentioned earlier.

Important properties of the structure are:

(1) a target color triangle (or color space) which is achieved due to the color point shift, (2) as high as possible energy efficiency (which is achieved as the difference between the excitation and emission spectrum of all three wavelengths converting elements is large enough to obtain a very high efficiency), (3) the use of three identical light sources for each sub-pixel of a pixel to improve the manufacturing process of displays according to the present invention.

An effect that occurs when using color converting layers is that one would imagine that one needs to absorb as much blue as possible which will be converted to e.g. red. But then the red needs to escape the layer and self-absorption needs to be minimized. These two requirements are competing, i.e. a high concentration for blue absorption and low concentration for red escape. As discussed earlier, deeper blue helps. It can be shown that when targeting maximum color conversion efficiency, some blue will leak through the structure due to the competition of both effects of conversion and self-absorption. However, this leakage can be removed by providing a blue absorbing layer after (i.e. above) the wavelength converting layer. Mixing this blue absorption into the wavelength converting layer itself will not help in increasing efficiency as some blue photons will be already absorbed in the first part of the color converting layers if the absorbing material is mixed with the color converting material.

Figure 5:
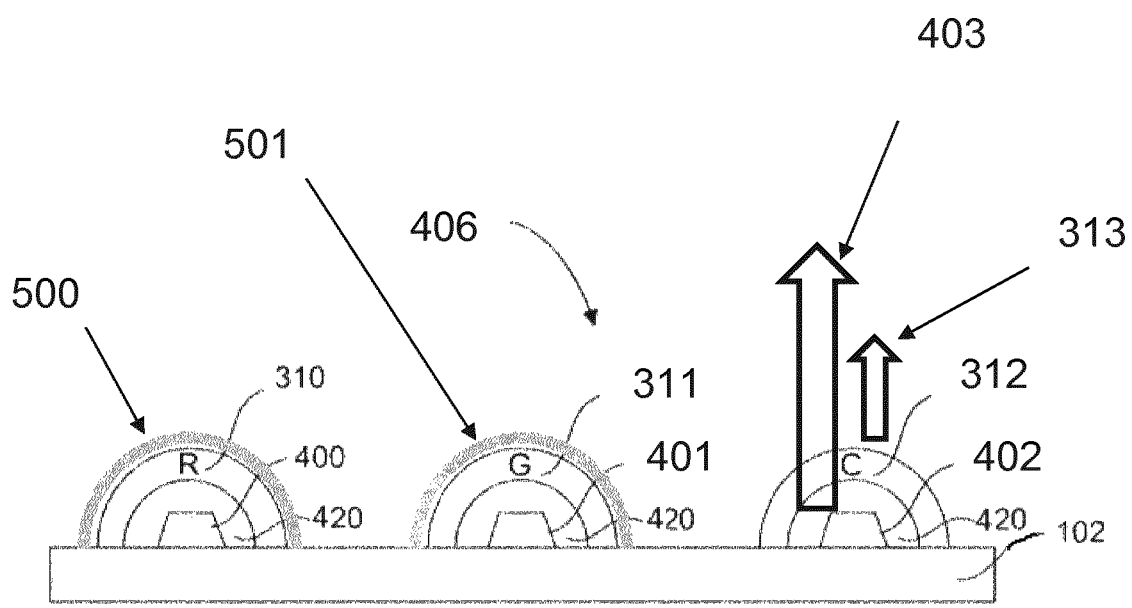
FIG. 5 is a schematic representation of a pixel structure according to another embodiment of the present invention.

In a second aspect of the invention, a filter is positioned on the first and second wavelength converting layers of the red and green sub-pixels as illustrated on FIG. 5. The filter can be identical for both sub-pixels or the filter 500 on the red sub-pixel can be different from the filter 501 on the green sub-pixel.

The filters 500, 501 can be e.g. screen printed on the sub-pixels.

The filters 500 and 501 filter out blue light emitted by the LED 400, 401 and that would pass through the wavelength converting layer.

The filters 500, 501 can also be designed to absorb blue and other wavelengths found in the spectrum of ambient light (e.g. sunlight or artificial light is expected in the surroundings of the LED display). This will advantageously increase the contrast of the LED displays that uses pixels according to embodiments of the present invention. All wavelengths will be absorbed, with the exception of the targeted emission wavelengths (in order to reach the target color points); red for the red pixel, blue and cyan for the blue pixel, and green for the green pixel. Such a filter can also be printed on the blue pixel in order to remove some ambient light, with the exception of the wavelengths which contribute to the target blue color point.

Figure 6:
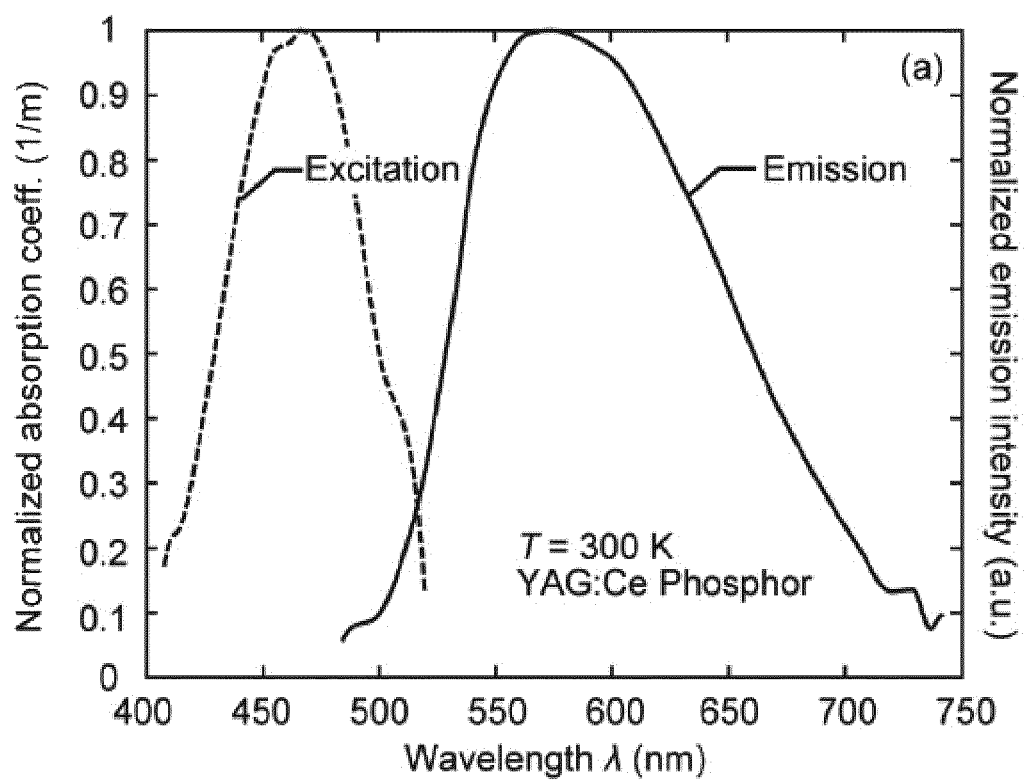
FIG. 6 is a graph showing the spectrum of a white LED showing blue light directly emitted by the GaN-based LED used to excite a phosphor and the Stokes-shifted light emitted by a Ce3+:YAG phosphor.

FIG. 6 shows the spectrum of a white LED showing blue light directly emitted by the GaN-based LED (peak at about 465 nm) used to excite a phosphor and the more broadband Stokes-shifted light emitted by the Ce3+:YAG phosphor, which emits at roughly 500-700 nm.

For this particular phosphor, absorption (excitation) peaks are at about 465 nm. If it is assumed that it would have peaked at 450 nm, it would have been better to pump the phosphor at 450 nm for efficiency reasons.

Figure 7:
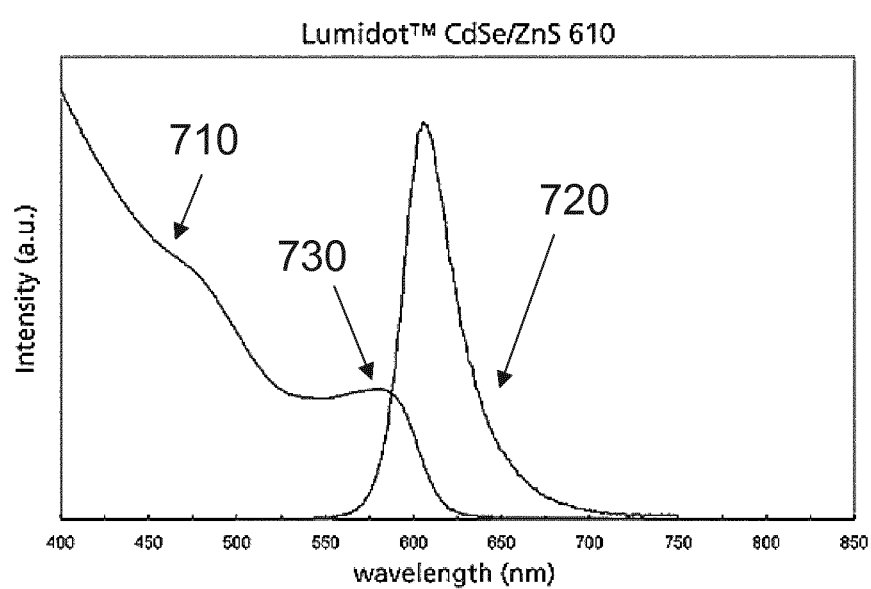
FIG. 7 illustrates the spectrum of a Lumidot™ CdSe/ZnS 610 nm red emitting quantum dot particles from Sigma-Aldrich®.

FIG. 7 shows as an example the spectrum of a Lumidot™ CdSe/ZnS 610 nm red emitting quantum dot particles from Sigma-Aldrich®. The line 710 represents the absorption spectrum and line 720 represents the fluorescence. From the graph, it is clear that at deep UV the absorption is most efficient and quickly increases. An optical filter which attenuates wavelengths below 500 nm will not only attenuate the blue light reflected on the LEDs, it will also prevent excitation of the wavelength converting layer by blue light present in the ambient light (i.e. light emitted by sources of light others than the LED devices 400, 401, 402). A pigment dispersed in the wavelength converting layer is expected to be less efficient than a filter positioned on the wavelength converting layer (i.e. farther away from the blue LED 400, 401, 402 than the wavelength converting layer). Indeed, such a filter will not attenuate the blue light emitted by the LED 400, 4001, 402 before it can interact with the wavelength converting layer. Blue light emitted by external sources will first be attenuated before it reaches the wavelength converting layer.

As can be seen from FIGS. 6 and 7, a difference between phosphor particles and quantum dots (but also quantum platelets) is the spectral bandwidth of the emitted light. Advantages of quantum dots/platelets are that they produce pure and saturated emission colors with narrow bandwidth, characterized by a full width at half the maximum value in the range of 20-45 nm. Their emission wavelength can be tuned by changing the size of the quantum dots.

On the contrary, most phosphor particles have a broad band emission spectrum. The color point associated with the emitted light by the phosphor particles will tend to be closer to the white point in the color space than for quantum dots/quantum particle based wavelength converting layers, and will thus not be on the left of the lines as illustrated in FIGS. 9 and 10.

The core of the quantum dots/quantum platelets of the wavelength converting layer according to embodiments of the present invention can be Indium Phosphide-Based or Cadmium Selenide-Based.

Wavelength converting layers comprising quantum dots and/or quantum platelets are particularly suitable for high resolution displays, in particular due to the size of the quantum dots/quantum platelets. In fact, the size of the pixels (each pixel comprising three sub-pixels) which can be reached is below 1 mm with a pixel pitch of about 1 mm. Such dimensions cannot be achieved with phosphors as phosphor particles are too big, of the order of 10 μm. Grinding the phosphor particles would reduce their size but would also affect their efficiency.

Quantum dots/quantum platelets LED displays are to be mass produced using ink-jet printing. (1) Ink-jet printing of phosphor particles would require too much time. As the size of the phosphor particles is much larger, a much thicker conversion would be needed and, (2) due to the abrasive nature of the phosphor grains and longer time, the printer head should also be replaced frequently.

Phosphors are thus not suitable for color conversion on a high-resolution display due to their size and to their broader spectral bandwidth.

Although the embodiments of the present invention are described with reference to LED light sources, the invention is not limited thereto. Any light source which is suitable for exciting a wavelength converting layer in accordance with the embodiments of the present invention can be used. For example, OLEDs can also be used with the embodiments of the present invention.

While the invention has been described hereinabove with reference to specific embodiments, this was done to clarify and not to limit the invention. The skilled person will appreciate that various modifications and different combinations of disclosed features are possible without departing from the scope of the invention.

The invention claimed is:

1. A display device comprising:
an array of pixels, each pixel comprising at least three sub-pixels, each sub-pixel comprising a LED device configured to emit a color spectrum having a light source color point, the light source color point is a blue color point, the three LED devices being of the same type,
wherein the LED device of a first sub-pixel is a blue LED device covered with a first wavelength converting layer designed to emit red light having a first color point,
the LED device of a second sub-pixel is a blue LED device covered with a second wavelength converting layer designed to emit green light having a second color point,
the blue color point, the first color point and the second color point defining a first color space which is different from a set color space, wherein the LED device of a third sub-pixel is a blue LED device covered with a third wavelength converting layer designed to emit light with a dominant wavelength having a fourth color point, the fourth color point being a cyan color point, wherein some of the light from the blue LED device is not converted by the third wavelength converting layer and some of the light from the blue LED device is converted by the third wavelength converting layer, said fourth color point being such that the combination of light emitted by the LED device not converted by the third wavelength converting layer and the light converted by the wavelength converting layer results in light having a third color point, the third color point being a combination of the light of the blue color point and the light of the cyan color point, wherein the first, the second and the third color points define a second color space in which the set color space is included.

2. The display device according to claim 1, wherein light emitted by the LED devices of the first to third subpixels is the same and has a dominant wavelength equal to or less than 455 nm, and/or wherein light emitted by the LED devices of the first to third subpixels is the same and has a dominant wavelength in the interval of 420 nm to 455 nm, or a dominant wavelength less than 455 nm and more than 400 nm, or more than 380 nm, or more than the transparent absorption edge of the used materials in the pixels.

3. The display device according to claim 1, wherein a wavelength of light emitted by the LED device of the third sub-pixel and light emitted by the third wavelength converting layer differ at least by 25 nm, preferably up to 35 nm, and even more preferably up to 45 nm.

4. The display device according to claim 1, wherein the set color space is any one of Rec 709, Rec 2020, sRGB, DCI-P3, and/or wherein the fourth color point is such that it is located in the chromaticity diagram color space on the left of the line joining the blue light source color point and the third color point, above the third color point.

5. The display device according to claim 1, wherein a thickness of the third wavelength converting layer and the density of down-converting material in the third wavelength converting layer is chosen such that the appropriate amount of light emitted by the LED of the third sub-pixel is being converted so as to achieve the third color point when the converted light having the fourth color point and unconverted light having the light source color point are combined.

6. The display device according to claim 1, wherein the three LED devices have the same dominant wavelength, spectrum half-width, or radiant flux, and/or the three LED devices are from the same manufacture and/or the three LED devices emit light of the same color.

7. The display device according to claim 1, wherein the third wavelength converting layer is configured to emit light at a wavelength greater than 480 nm and/or preferably less than 520 nm, and even more preferably 490 nm when excited by the blue light emitted by the LED device of the third sub-pixel, and/or wherein the first wavelength converting layer is configured to emit light at 620 nm when excited by the blue light of the first LED device, and/or wherein the second wavelength converting layer is configured to emit light at 532 nm when excited by the blue light of the second LED device.

8. The display device according to claim 1, wherein preferably less than 10% or preferably less than 5% or preferably less than 1% of the blue light emitted by the LED device of the first sub-pixel escapes through the first wavelength converting layer, and/or wherein preferably less than 10% or preferably less than 5% or preferably less than 1% of the blue light emitted by the LED device of the second sub-pixel escapes through the second wavelength converting layer.

9. The display device according to claim 1, wherein the wavelength converting layers comprise quantum platelets or quantum dots.

10. The display device according to claim 1, wherein a first filter is positioned on the first wavelength converting layer, and/or a second filter is positioned on the second wavelength converting layer, and/or a third filter is positioned on the third wavelength converting layer.

11. The display device according to claim 10, wherein the first and/or second filters filter out blue light emitted by the respective LED devices which passes through the respective wavelength converting layer.

12. The display device according to claim 10, wherein the first and/or second filters and/or third filters absorb at least a portion of wavelengths found in the spectrum of ambient light except for the wavelengths which correspond to the first color point for the first filter, the second color point for the second filter and the blue and fourth color point for the third filter.

13. A method of manufacturing a display device comprising:

forming an array of pixels, each pixel comprising at least three sub-pixels, each sub-pixel comprising a LED device configured to emit a color spectrum having a light source color point, the light source color point being blue, the LED devices of the at least three sub-pixels all being of the same type, covering the LED device of a first sub-pixel with a first wavelength converting layer designed to emit red light having a first color point, covering the LED device of a second sub-pixel with a second wavelength converting layer designed to emit green light having a second color point, the light source color point, the first color point and the second color point defining a first color space which is different from a set color space, covering the LED device of a third sub-pixel with a third wavelength converting layer designed to emit light with a dominant wavelength having a fourth color point, the third sub-pixel being a blue LED device, said fourth color point being a cyan color point, wherein some of the light from the blue LED device is not converted by the third wavelength converting layer and some of the light from the blue LED device is converted by the third wavelength converting layer, said fourth color point being such that the combination of the blue light emitted by the LED device not converted by the third wavelength converting layer and the cyan light converted by the third wavelength converting layer results in light having a third color point, the third color point being a combination of the light of the blue color point and the light of the cyan color point, wherein the first, the second and the third color points define a second color space in which the set color space is included.

14. The method according to claim 13, wherein the light emitted by the LED devices of the first to third subpixels is the same and has a dominant wavelength equal to or less than 455 nm, and/or wherein the light emitted by the LED devices of the first to third subpixels is the same and has a dominant wavelength in the interval of 420 nm to 455 nm, or a dominant wavelength less than 455 nm and more than 400 nm, or more than 380 nm, or more than the transparent absorption edge of the used materials in the pixels.

15. The method according to claim 13, wherein a thickness of the third wavelength converting layer and a density of down-converting material in the third wavelength converting layer is chosen such that an appropriate amount of light emitted by the LED of the third sub-pixel is being converted so as to achieve the third color point when the converted light having the fourth color point and unconverted light having the light source color point are combined.

16. The method according to claim 13, wherein the LED devices have the same dominant wavelength, spectrum half-width, or radiant flux, and/or wherein the three LED devices are from the same manufacturer, and/or wherein the three LED devices emit light of the same color.

17. The method according to claim 13, wherein preferably less than 10% or preferably less than 5% or preferably less than 1% of the blue light emitted by the LED device of the first sub-pixel escapes through the first wavelength converting layer, and/or wherein preferably less than 10% or preferably less than 5% or preferably less than 1% of the blue light emitted by the LED device of the second sub-pixel escapes through the second wavelength converting layer.

18. The method according to claim 13, wherein a first filter is positioned on the first wavelength converting layer, and/or a second filter is positioned on the second wavelength converting layer, and/or a third filter is positioned on the third wavelength converting layer; and
wherein the first and/or second filter out blue light emitted by the respective LED devices which passes through the respective wavelength converting layer.

19. The method according to claim 13, wherein a first filter is positioned on the first wavelength converting layer, and/or a second filter is positioned on the second wavelength converting layer, and/or a third filter is positioned on the third wavelength converting layer; and
wherein the first and/or second filters and/or third filters absorb at least a portion of wavelengths found in the spectrum of ambient light except for the wavelengths which correspond to the first color point for the first filter, the second color point for the second filter and the blue and fourth color point for the third filter.

20. A pixel structure comprising at least three sub-pixels, each sub-pixel comprising a LED device configured to emit a color spectrum having a light source color point, the light source color point being a blue color point, the three LED devices being of the same type,
wherein the LED device of a first sub-pixel is covered with a first wavelength converting layer designed to emit red light having a first color point,
the LED device of a second sub-pixel is covered with a second wavelength converting layer designed to emit green light having a second color point,
the blue color point, the first color point and the second color point defining a first color space which is different from a set color space,
the LED device of a third sub-pixel is covered with a third wavelength converting layer designed to emit light with a dominant wavelength having a fourth color point, the third sub-pixel being a blue LED device, the fourth color point being a cyan color point, wherein some of the light from the blue LED device is not converted by the third wavelength converting layer and some of the light from the blue LED device is converted by the third wavelength converting layer, said fourth color point being such that the combination of light emitted by the LED device not converted by the wavelength converting layer and the light converted by the wavelength converting layer results in light having a third color point, the third color point being a combination of the light of the blue color point and the light of the cyan color point, wherein the first, the second and the third color points define a second color space in which the set color space is included.

* * * * *